(12) United States Patent
Leonardi et al.

(10) Patent No.: US 7,960,244 B2
(45) Date of Patent: Jun. 14, 2011

(54) PROCESS FOR THE ALIGNED MANUFACTURE OF ELECTRONIC SEMICONDUCTOR DEVICES IN A SOI SUBSTRATE

(75) Inventors: Salvatore Leonardi, Aci Sant'Antonio (IT); Roberto Modica, Catania (IT)

(73) Assignee: STMicroelectronics, S.r.l., Agrate Brianza (IT)

( * ) Notice: Subject to any disclaimer, the term of this patent is extended or adjusted under 35 U.S.C. 154(b) by 337 days.

(21) Appl. No.: 11/339,815

(22) Filed: Jan. 24, 2006

(65) Prior Publication Data

US 2006/0194408 A1 Aug. 31, 2006

(30) Foreign Application Priority Data

Feb. 24, 2005 (EP) .................... 05425096

(51) Int. Cl.
*H01L 21/76* (2006.01)
(52) U.S. Cl. ........ 438/430; 438/424; 438/431; 438/439; 438/975; 257/E23.179; 257/797
(58) Field of Classification Search .................. 438/401, 438/431, 439, 442, 462, 975; 437/21; 257/797
See application file for complete search history.

(56) References Cited

U.S. PATENT DOCUMENTS

| | | | |
|---|---|---|---|
| 5,032,529 A | 7/1991 | Beitman et al. | |
| 5,137,837 A | 8/1992 | Chang et al. | |
| 5,559,722 A | 9/1996 | Nickerson | |
| 5,811,315 A | 9/1998 | Yindeepol et al. | |
| 5,914,523 A * | 6/1999 | Bashir et al. | 257/520 |
| 5,981,359 A * | 11/1999 | Onishi | 438/442 |
| 6,096,621 A | 8/2000 | Jennings | |
| 6,331,470 B1 | 12/2001 | Sanfilippo et al. | |
| 6,368,936 B1 | 4/2002 | Yoshida | |
| 6,413,827 B2 | 7/2002 | Farrar | |

(Continued)

FOREIGN PATENT DOCUMENTS

EP 0 376 722 7/1990

OTHER PUBLICATIONS

EP 05 42 5096 Stmicroelectronics S.R.L., Dec. 22, 1925 (Search Report).

*Primary Examiner* — Marcos D. Pizarro
*Assistant Examiner* — Eva Yan Montalvo
(74) *Attorney, Agent, or Firm* — Lisa K. Jorgenson; Kevin D. Jablonski; Graybeal Jackson LLP (57) ABSTRACT

A process for manufacturing an electronic semiconductor device, wherein a SOI wafer is provided, formed by a bottom layer of semiconductor material, an insulating layer, and a top layer of semiconductor material, stacked on top of one another; alignment marks are formed in the top layer; an implanted buried region is formed, aligned to the alignment marks; a hard mask is formed on top of the top layer so as to align it to the alignment marks; using the hard mask, the top layer is selectively removed so as to form a trench extending up to the insulating layer; there a lateral-insulation region in the trench, that is contiguous to the insulating layer and delimits with the latter an insulated well of semiconductor material; and electronic components are formed in the top layer.

17 Claims, 12 Drawing Sheets

U.S. PATENT DOCUMENTS

| | | |
|---|---|---|
| 6,677,209 B2 | 1/2004 | Farrar |
| 6,774,452 B1 | 8/2004 | Ramkumar et al. |
| 6,800,917 B2 | 10/2004 | Haynie et al. |
| 2001/0036710 A1* | 11/2001 | Hayashi et al. ............... 438/439 |
| 2002/0146867 A1* | 10/2002 | Salvatore ..................... 438/149 |
| 2003/0020117 A1 | 1/2003 | Lee et al. |
| 2003/0127671 A1 | 7/2003 | Kim |
| 2004/0021169 A1* | 2/2004 | Leonardi ....................... 257/314 |
| 2004/0152278 A1 | 8/2004 | Farrar |
| 2004/0222485 A1 | 11/2004 | Haynie et al. |

* cited by examiner

Fig.14

PROCESS FOR THE ALIGNED MANUFACTURE OF ELECTRONIC SEMICONDUCTOR DEVICES IN A SOI SUBSTRATE

PRIORITY CLAIM

This application claims priority from European patent application No. 05425096.4, filed Feb. 24, 2005, which is incorporated herein by reference.

TECHNICAL FIELD

Embodiments of the present invention relate to processes for manufacturing electronic semiconductor devices in silicon-on-insulator (SOI) substrates.

More specifically, embodiments of the invention relate to the integration of unipolar and bipolar electronic semiconductor devices, also of complementary type, in dielectrically totally insulated wells and for supply voltages of up to some tens of volts. The devices to which embodiments of the invention relate are of the "partially depleted" type, i.e., the breakdown-voltage strength of the device also involves the bulk region of the insulation well.

BACKGROUND

As is known, the total dielectric insulation between one or more integrated devices can be obtained by integrating dielectric trenches in substrates of a SOI type in order to form dielectrically insulated wells. These wells are characterized by the presence of a buried-oxide (BOX) layer, which ensures a vertical insulation of the devices, and by the presence of dielectric trenches, which ensure lateral electrical insulation. The continuity between the buried-oxide layer and the dielectric trenches ensures total dielectric insulation of the devices. Furthermore, a field-oxide region delimits the active area where the electronic components are integrated.

Figure 1:
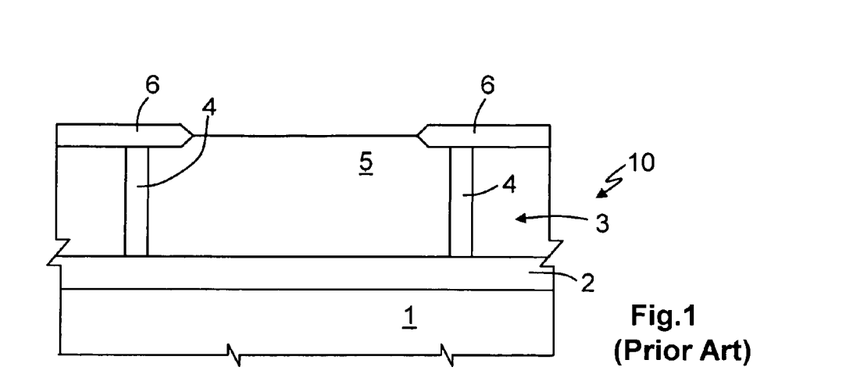
FIG. 1 shows the cross-section of a known insulation structure.

FIG. 1 is a schematic representation of the cross-section of a portion 10 of a semiconductor device, comprising a dielectrically insulated well according to the known art. In particular, the portion 10 comprises a bottom region 1, also known as handle-wafer, which normally acts as mechanical support (in case of integration of complex devices, it is sometimes used also as active silicon layer), a buried-oxide (BOX) layer 2, forming a vertical insulation element, and a structural layer 3, of silicon, which, together with the previous layers, forms a silicon-on-insulator (SOI) substrate. An electrical-insulation region 4, of dielectric material, insulates laterally a well 5 and extends up to contact with the oxide layer 2. The surface area of the well 5 is moreover delimited by a field-oxide region 6, which defines the so-called active region or active area of the integrated components within the well 5. The field-oxide region 6 is in contact with the electrical-insulation region 4 and has, in the part inside the well 5, a cusp-like shape referred to, notoriously, as "bird's beak" for the particular conformation derived from the technique used during integration, in this case, the known LOCOS (Local Oxidation of Silicon) technique.

The use of this technique is particularly appreciated in so far as it guarantees that the surface of the entire wafer (and thus also of the well) is sufficiently planar to be able to integrate other layers, either deposited or grown ones, such as, for example, photoresist, nitride, vapox, oxide, metallization layers, etc., necessary for completing integration of the various components. In fact, in the active regions, the silicon-oxide interface is displaced further up with respect to the silicon-oxide interface of the field regions (with thick oxide) by approximately one half of the thickness of the field oxide. This step is almost identical to the surface step that is created between the surface of the thick oxide and the surface of the thin oxide. If the LOCOS technique were not used, any step of non-localized oxidation would entail in fact the presence of a single silicon-oxide interface in a uniform way on the entire surface, and consequently the subsequent etching step for forming the active region, for a same field oxide thickness, would generate a surface step having a thickness practically identical to the thickness of the etched field oxide (and thus in practice with a thickness twice that of the LOCOS structure), causing a poorer planarity of the surface.

From this point of view, the LOCOS technique is advantageous and, notoriously, very diffused, above all in the integration of technologies of the MOS type. Once the LOCOS structure has been defined, the next step is to usually proceed to the integration of the various layers necessary for forming the components. Integration of these layers uses the same LOCOS structure as reference for alignment of the subsequent masks.

Even though, in junction-insulated technologies or partially dielectrically insulated technologies, the formation of the dielectric trench and of the active region is quite consolidated, it should again be noted that, in the case of technologies with total dielectric insulation of the well, the formation of the trenches and of the active region via the LOCOS technique calls for compromises in the process and structure, which, according to the characteristics of the technology to be used, render their integration far from versatile. In particular, with these technologies the insulation well is subjected to mechanical stress due to the presence of the silicon-dielectric interface that surrounds the entire insulation well. The mechanical stress can be caused, for example, by the different expansion coefficient of the dielectric material with respect to silicon in case of thermal cycles or else by the different stoichiometric ratio with which the silicon combines with the various materials that characterize the silicon-dielectric interface in general or also by the local structural conformation that characterizes the silicon-oxide interface. The presence of excessive mechanical stress tends to distort the reticular structure of silicon so that dislocations and, in general, defects tend to form that alter the electrical characteristics of the devices. In particular, the dislocations and alterations of the lattice structure are generated in some critical areas of the insulation well, such as in the silicon region between the electrical-insulation region 4 and the field-oxide region 6, in the silicon region underlying the bird's beak structure, and in the bulk silicon region between the oxide layer 2 and the electrical-insulation region 4.

To overcome the above problems various solutions have been proposed. For example, the hard mask layers necessary for forming the trench on the SOI substrate are used also for forming the active area via LOCOS. This process, however, does not ensure a high performance from the standpoint of defectiveness.

In another approach, lateral dielectric insulation is made at the end of the process sequence, so as to prevent integration of the hard mask necessary for forming the trench being subject to the thermal cycles necessary for the various layers that integrate components within the well. This solution entails a laborious and complex process sequence, with major constraints on the entire structure of the device on account of the selectivity of the materials to be used for the various etching steps, as well as a higher integration cost associated to the laborious industrial-process flow and consequent problems of industrial output.

Still another approach uses integration of MOS devices for low or very low voltages in a SOI wafer with trench insulation, without any versatility in the interchangeability of the process modules and without any teaching as regards the self-alignment of the various layers to the trenches.

There is a need to overcome the drawbacks of the known solutions, providing an integration process in a simplified SOI substrate.

SUMMARY

According to an embodiment of the present invention, a process for manufacturing an electronic semiconductor device is provided. An SOI wafer is provided, formed by a bottom layer of semiconductor material, an insulating layer, and a top layer of semiconductor material, stacked on top of one another. Alignment marks are formed in the top layer. An implanted buried region is formed, aligned to the alignment marks, and a hard mask is formed on top of the top layer so as to align it to the alignment marks. Using the hard mask, the top layer is selectively removed so as to form a trench extending up to the insulating layer. A lateral-insulation region is formed in the trench, contiguous to the insulating layer and delimiting with the latter an insulated well of semiconductor material. Electronic components are formed in the top layer.

BRIEF DESCRIPTION OF THE DRAWINGS

For an understanding of the present invention, preferred embodiments are now described, purely as non-limiting examples, with reference to the attached drawings, wherein.

DETAILED DESCRIPTION

The following discussion is presented to enable a person skilled in the art to make and use the invention. Various modifications to the embodiments will be readily apparent to those skilled in the art, and the generic principles herein may be applied to other embodiments and applications without departing from the spirit and scope of the present invention. Thus, the present invention is not intended to be limited to the embodiments shown, but is to be accorded the widest scope consistent with the principles and features disclosed herein.

In FIG. 2, a wafer 20 of a SOI type, comprising a bottom semiconductor region 21, a buried-oxide layer (BOX) 22 and a structural silicon layer 23 of N type, is oxidized superficially to form a thin oxide layer 24; then a nitride layer 25 is grown.

Figure 2A:
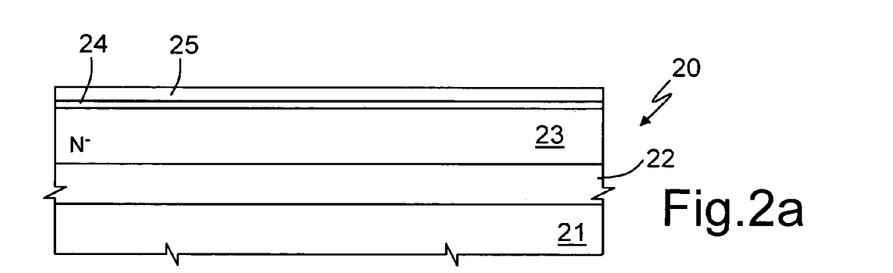
FIGS. 2a-2f are cross-sections through a portion of a SOI wafer in successive manufacturing steps of a first embodiment of the invention.
Figure 2B:
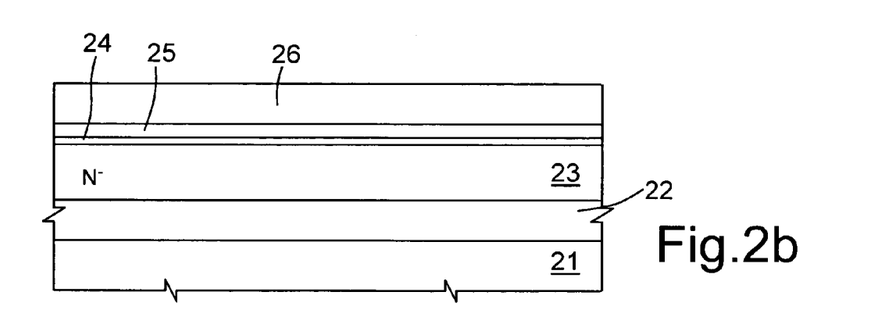
Figure 2C:
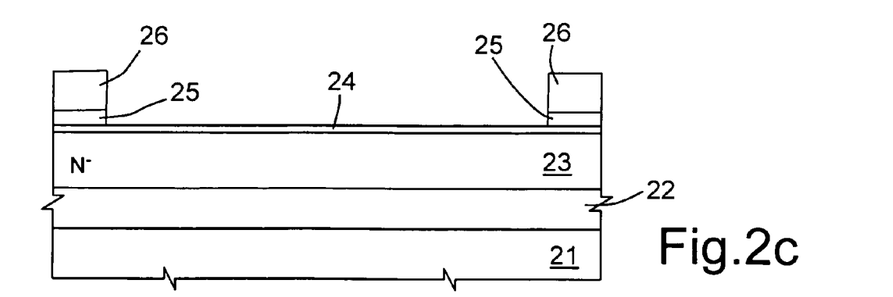
Figure 2D:
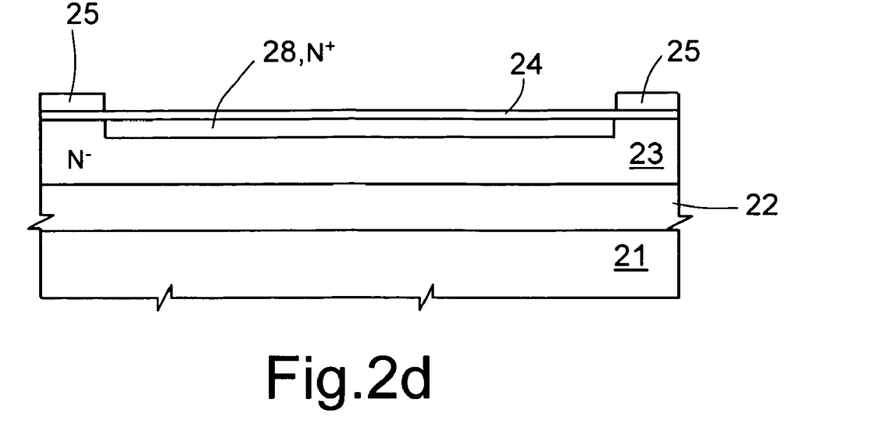

Next (FIG. 2b), a resist layer 26 is deposited on the nitride layer 25. Then the steps of photomasking, resist development and etching of the nitride layer 25 are carried out (FIG. 2c); an implantation of a first type of conductivity, for example of N type, at a high dose is performed (thin implanted layer 28 of FIG. 2d) for forming deep collectors of NPN bipolar components, and the resist layer is removed.

Figure 2E:
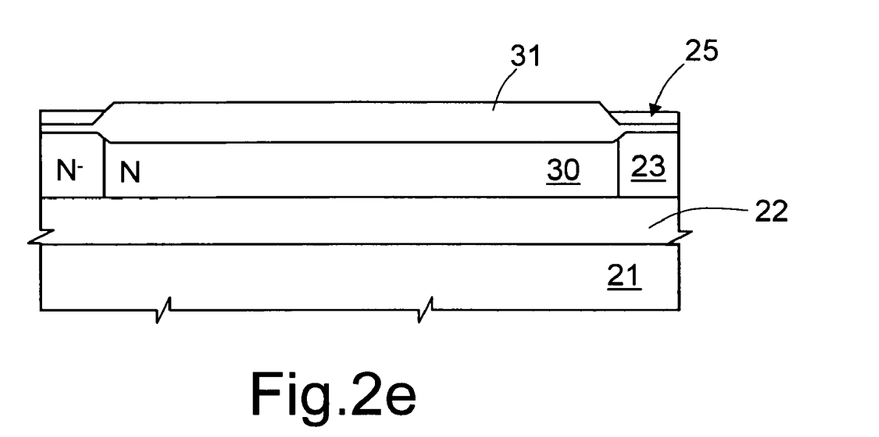
Figure 2F:
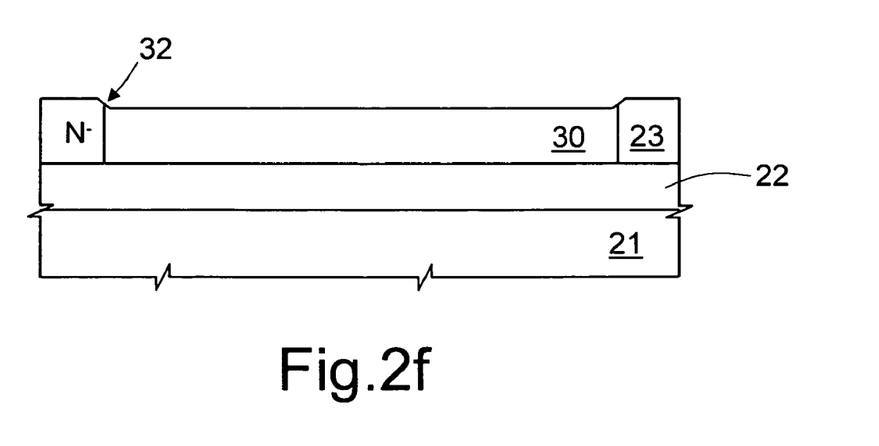

Next, a thermal process is performed (for example, at approximately 1000° C.), which has the dual function of diffusing the first implanted buried layer 28, forming a first buried layer 30, here of N type, and simultaneously growing a thick oxide layer 31 on the surface free from nitride (FIG. 2e); the subsequent total removal of the nitride layer 25 and of the oxide grown on the surface (thin oxide layer 24 and thick oxide layer 31) generates a step 32 on the surface of the structural layer 23 between the area where only the thin oxide layer 24 was present, due to the presence of the nitride layer 25, and the area not covered by the nitride layer 25 where the thick oxide layer 31 was grown (FIG. 2f). If the thickness of the thin oxide layer 24 is considered as being negligible with respect to the thickness of the thick oxide layer 31 and if the ratio between the number of atoms per unit volume in silicon and in the silicon oxide is approximated to 2, then it may be assumed that the height of the aforesaid step 32 is equal to approximately one half of the thickness of the thick oxide layer 31.

Figure 3A:
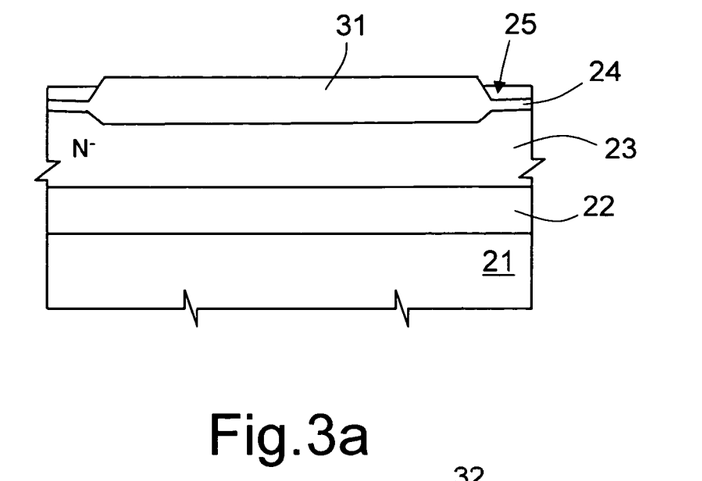
FIGS. 3a-3c are cross-sections of a second embodiment of the invention.
Figure 3B:
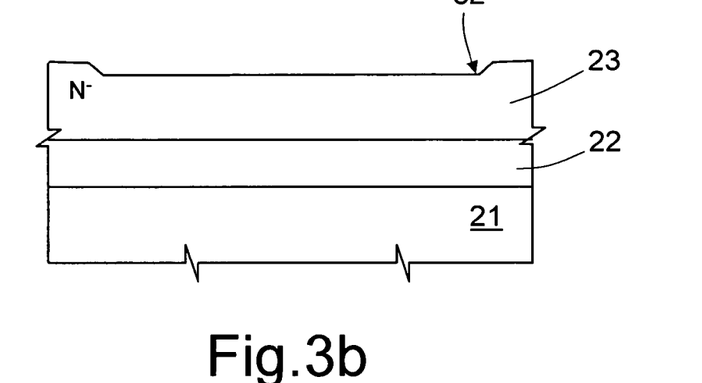
Figure 3C:
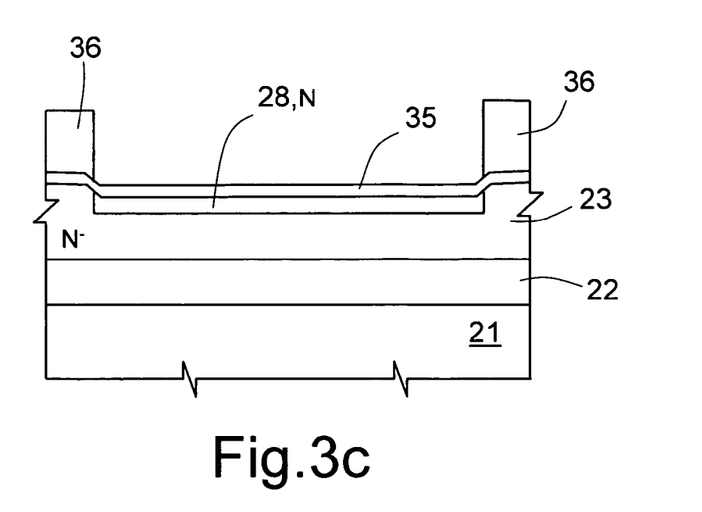

According to a different embodiment, the first buried layer 30 is implanted only upon creation of the alignment marks (steps 32). According to this solution, after forming the structure of FIG. 2c, the thick oxide layer 31 is thermally grown (FIG. 3a); the nitride layer 25, the thin oxide layer 24, and the thick oxide layer 31 are then removed, generating a step 32 (FIG. 3b). Then a pre-implantation oxide 35 is grown, a resist mask 36 is formed, and an N-type dopant is implanted, forming a thin implanted layer 28 (FIG. 3c). After removing the resist mask 36 and after the process of diffusion, the structure of FIG. 2f is obtained.

This second solution, albeit requiring a phototechnique and other additional processes, presents the considerable advantage of allowing the growth of a thick oxide separately from the diffusion of the first buried layer and moreover prevents said thick oxide from growing in the implanted areas.

Figure 4A:
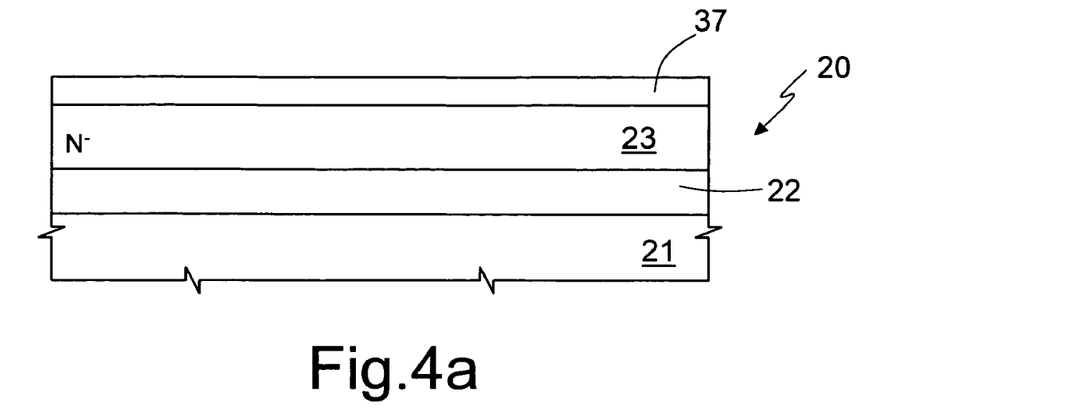
FIGS. 4a-4f are cross-sections of a third embodiment of the invention.
Figure 4B:
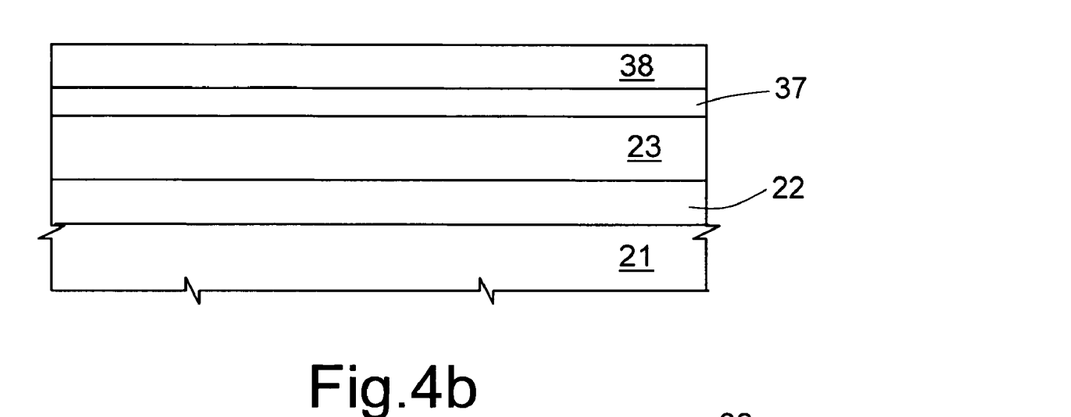
Figure 4C:
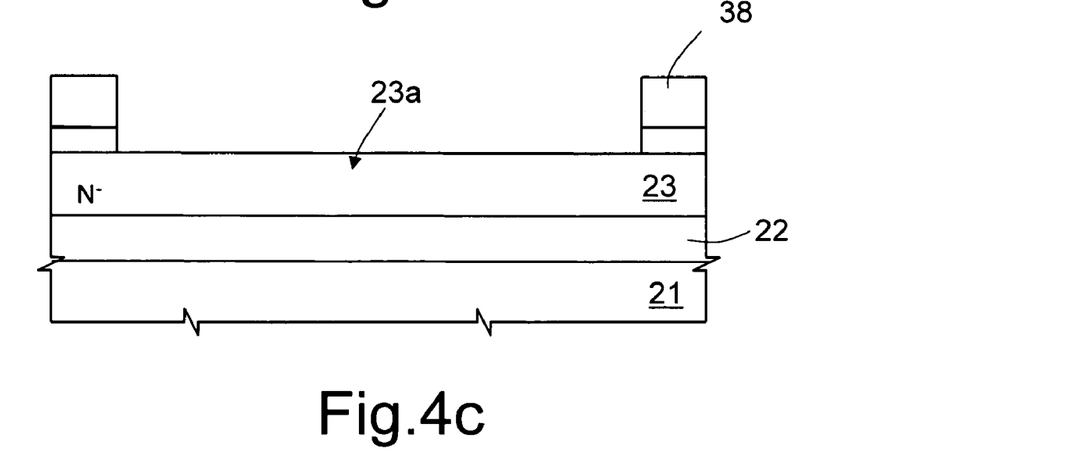

According to a third embodiment, it is possible to avoid resorting to the nitride layer 25 and to the LOCOS technique for forming the first buried layer 30 and generating alignment marks. In detail, starting from the SOI wafer 20 comprising the regions 21-23, thermal oxidation is performed for growing a thick oxide layer 37 (FIG. 4a). A photoresist layer 38 is deposited on the thick oxide layer 37 (FIG. 4b), and photomasking, resist development, and etching of the thick oxide layer 37 are performed, thereby a surface portion 23a of the structural region 23 is left exposed (FIG. 4c); after removing the resist 38, a thin pre-implantation oxide layer 39 is grown and an implantation of an N-type dopant is performed, forming a thin implanted layer 28 (FIG. 4d).

Figure 4D:
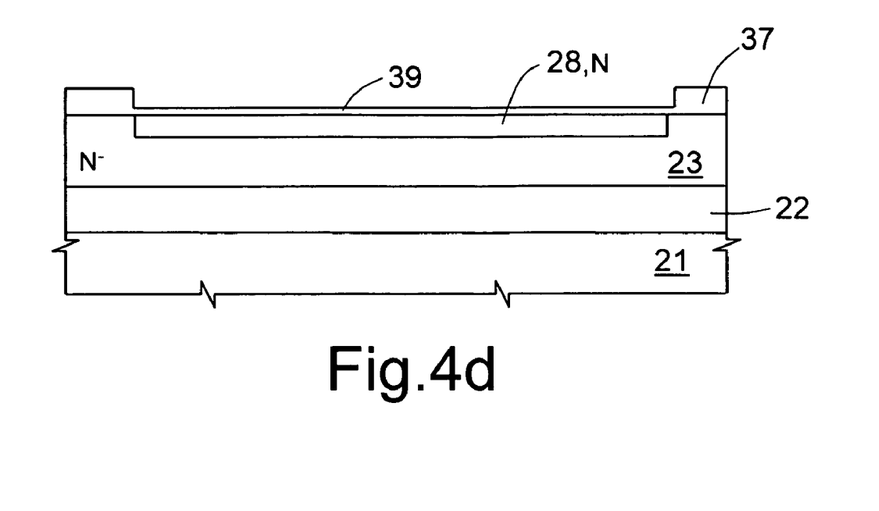
Figure 4E:
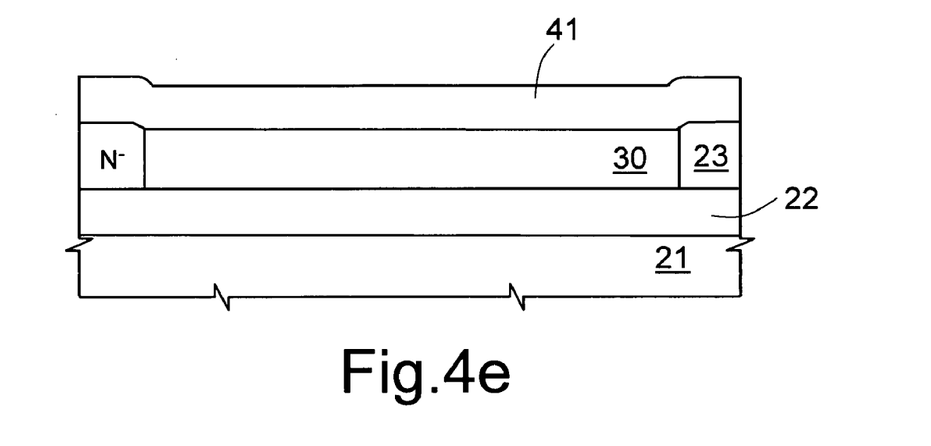

Next, a thermal process is performed, which has the dual function of diffusing the implanted dopant (forming the first buried layer 30) and of growing a sacrificial oxide layer 41 on the surface (FIG. 4e). If the thickness of the thick oxide layer 37 is calibrated appropriately, the growth of the sacrificial oxide layer 41 on the thick oxide layer 37 is negligible with respect to its growth on the surface portion 23a, so that the subsequent removal of the sacrificial oxide layer 41 generates steps 32 on silicon at the transition between these two areas (FIG. 4f), wherein the heights of the steps can be assumed as being equal to approximately one half of the thickness of the sacrificial oxide layer 41.

With this solution, modulation of dopant due to the bird's beak deriving from the use of the LOCOS technique is eliminated. However, given the function performed by the first buried layer 30 (deep collector), the electrical performance of the NPN bipolar component is not modified significantly. Also the stress created on silicon by the nitride layer is eliminated due to the advantage of a reduction in the possibility of onset of defects as a result of the subsequent manufacturing steps.

Figure 4F:
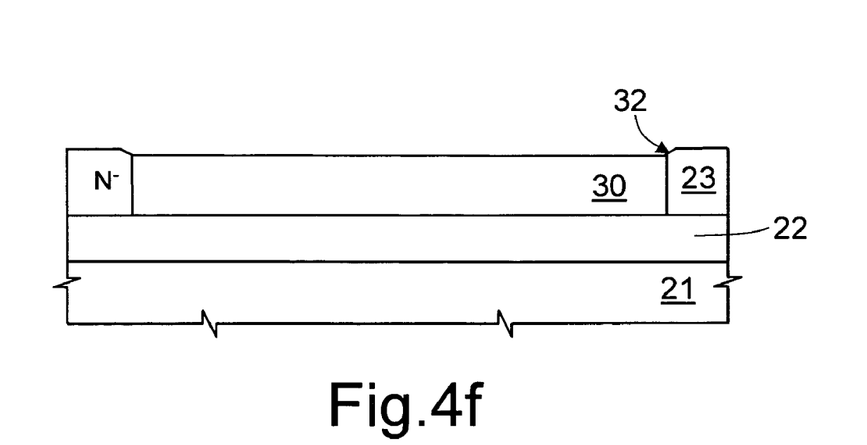
Figure 5A:
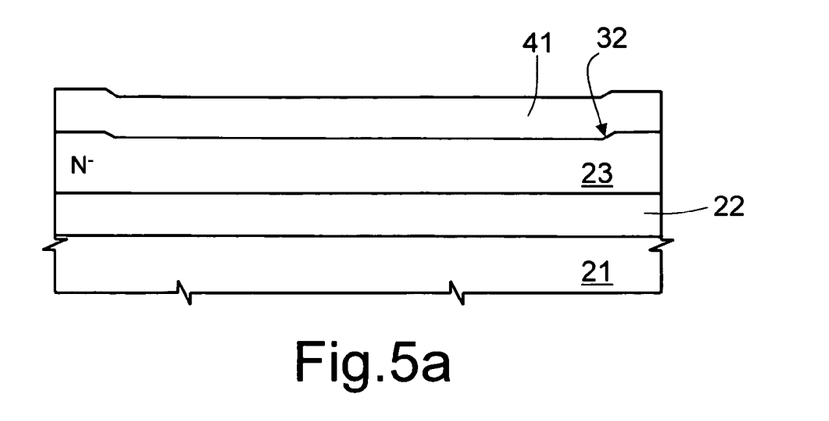
FIGS. 5a-5c are cross-sections of a fourth embodiment of the invention.
Figure 5B:
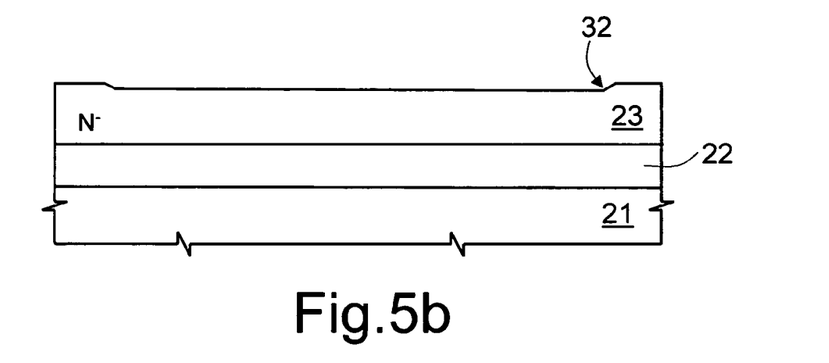
Figure 5C:
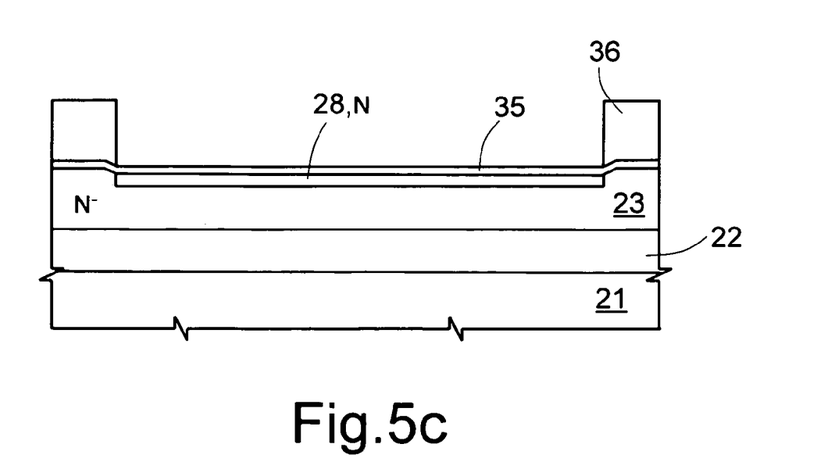

According to a variant of FIGS. 4d-4f, after forming and defining the thick oxide layer 37 and removing the resist layer, the thermal process is immediately performed, without previously growing a pre-implantation oxide layer and without carrying out dopant implantation. Starting then from the structure of FIG. 4c, the structure of FIG. 5a is obtained, in which growth of the sacrificial oxide layer 41 brings about formation of the step 32, as explained above. Then a pre-implantation oxide 35 is grown, a resist mask 36 is formed, an N-type dopant is implanted, and a thin implanted layer 28 is formed (FIG. 5c). After removal of the resist mask 36 and after the diffusion process, the structure of FIG. 4f is obtained. This solution presents the same advantages and characteristics as the solution of FIGS. 3a-3c.

Figure 6:
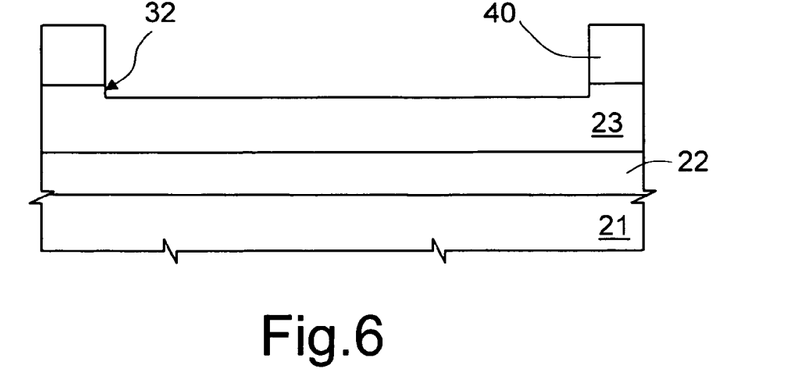
FIG. 6 is a cross-section of a fifth embodiment of the invention.

According to a fifth embodiment, it is possible to create alignment marks (steps on the silicon), starting from a SOI wafer 20 comprising the regions 21-23, with a process of silicon photomasking and etching, as shown in FIG. 6, where a resist mask 40 coats selectively and directly the structural layer 23. Etching of the structural layer 23 leads to formation of the steps 32 of a sufficient thickness (at least 0.1 μm) for the subsequent photomasking steps (zero layer).

Figure 7:
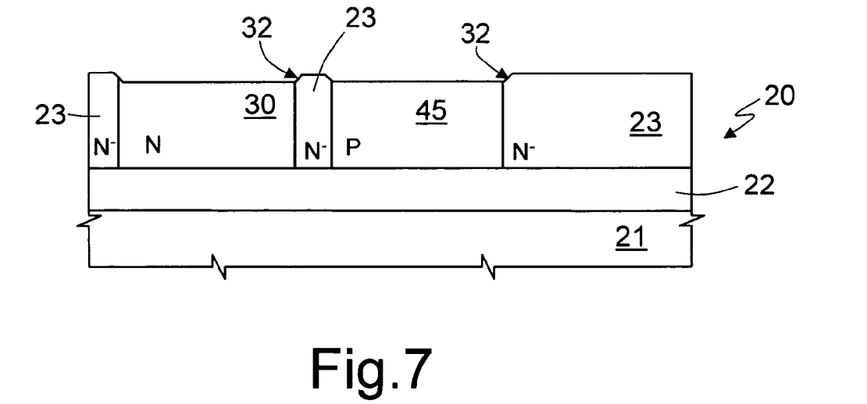
FIGS. 7 and 8 are cross-sections through a portion of a SOI wafer in successive manufacturing steps subsequent to those of FIGS. 2-6.

Following formation of the steps 32 and of the first buried layer 30, a second buried layer 45 is formed, having a conductivity type opposite to that of the first buried layer 30 (here, of P type), using steps similar to the ones described above for the first buried layer 30 (growth of a pre-implantation oxide, photomasking, development, P-type implantation at a high dose for forming the collector of the PNP bipolar components, and resist removal, thermal diffusion of the dopant implanted, and removal of the oxide from the surface of the structural layer 23). The structure of FIG. 7 is thus obtained.

Next (FIG. 8), an epitaxial silicon layer 46 is grown, N-type doped, having thickness and resistivity appropriate in relation to the voltage class of the devices that is intended to produce. The epitaxial layer 46 joins to the structural layer 23, forming as a whole a top semiconductor region 50. In a per se known manner, during growth of the epitaxial layer 46, the dopants of the buried layers 30 and 45 also diffuse, so that afterwards the buried layers 30 and 45 extend over a fair portion of the epitaxial layer 46, in a differentiated way, given their different mobility, without, however, reaching the surface 51 of the top semiconductor region 50.

Next, trenches of dielectric material are formed in the SOI wafer 20, as described hereinafter in detail with reference to FIGS. 9a-9h, which are at a reduced scale as compared to FIG. 8 and in which, for simplicity, only one part of the buried layer 30 is illustrated. The description, however, also applies to all the other buried layers (30 or 45) and, in general, to all the areas of the SOI wafer 20 where it is desired to obtain insulated wells.

Figure 9A:
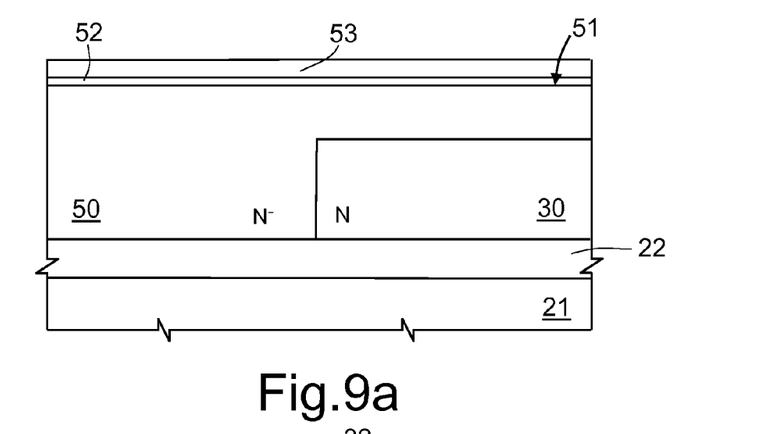
FIGS. 9a-9h are cross-sections through a portion of a SOI wafer in successive manufacturing steps subsequent to those of FIG. 8.
Figure 9B:
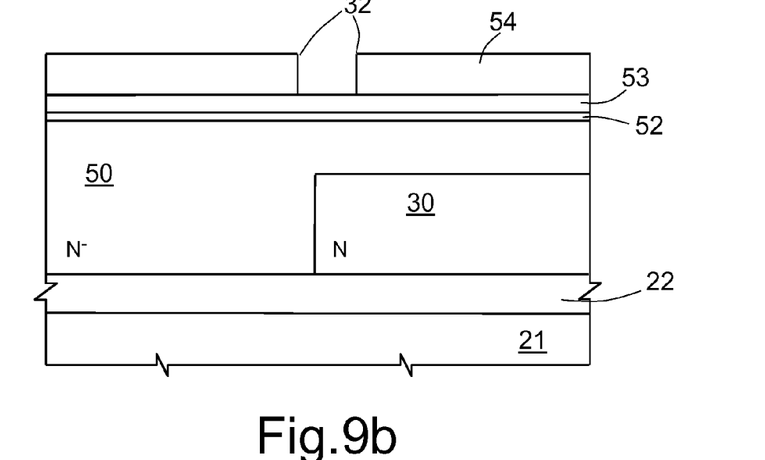
Figure 9C:
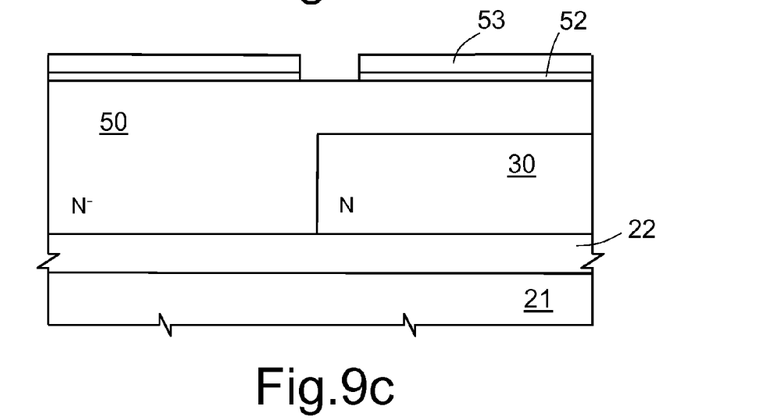
Figure 9D:
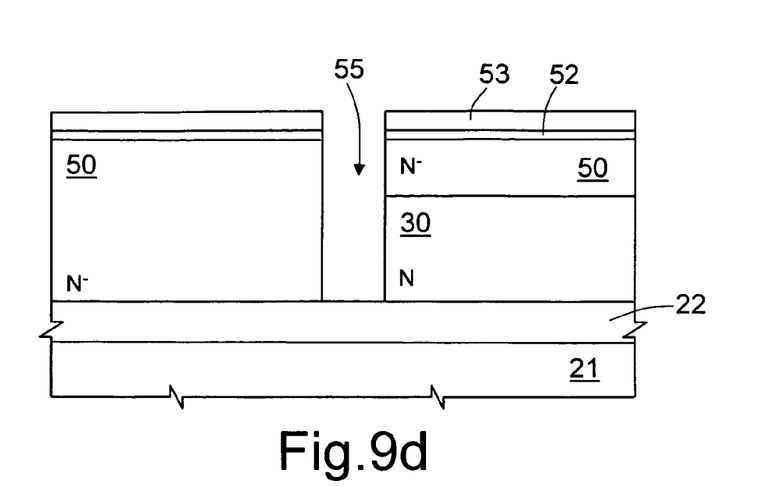
Figure 9E:
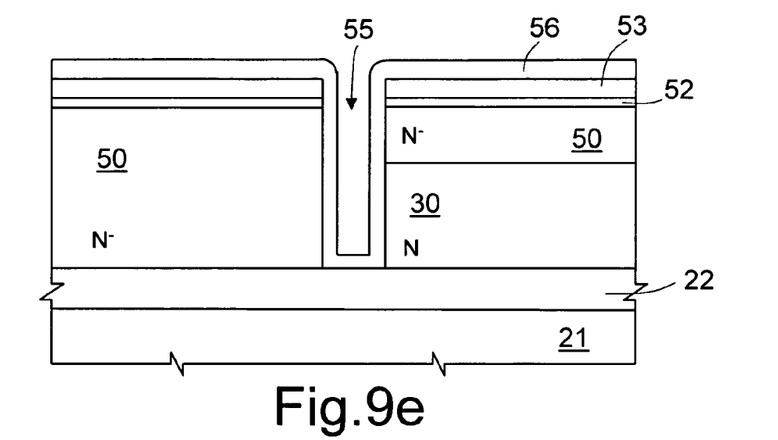

Initially (FIG. 9a), on the surface 51 of the top semiconductor region 50, a thin oxide layer 52 is grown and a nitride layer 53 is deposited, which operates as a hard mask. Then deposition, photomasking and resist 54 development are carried out (FIG. 9b), the nitride layer 53 and thin oxide layer 52 are etched where not covered by the resist 54, and the resist mask 54 is removed (FIG. 9c). Next, the silicon of the top semiconductor region 50 is dry etched for forming trenches 55. In this step, using an appropriate chemical etching, the etch selectivity between nitride and silicon is exploited, and the exposed silicon is anisotropically etched until the buried-oxide layer 22 is reached (FIG. 9d). In the example considered, the hard mask 53 has a shape such as to expose an area of the top semiconductor region 50 corresponding to the perimeter of the buried layer 30, in such a way that the trench 55, having in its top plan view a closed shape, surrounds laterally the buried layer 30 and separates it from the rest of the top semiconductor region 50 (as is more clearly evident from FIGS. 9i, 10-13).

Figure 9F:
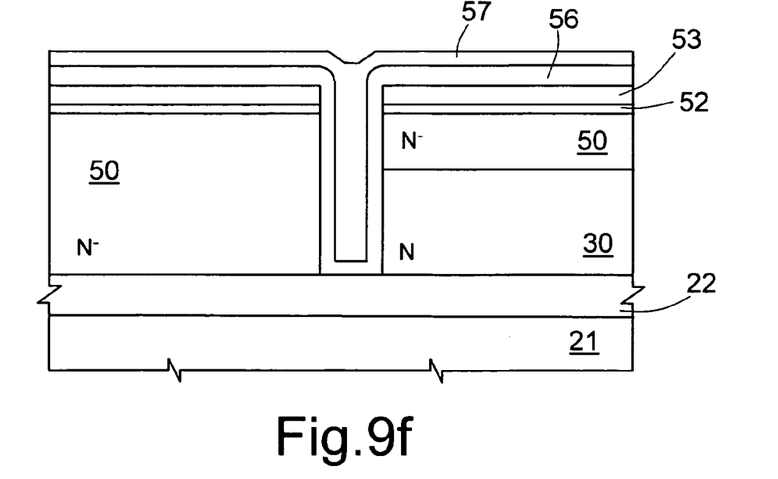
Figure 9G:
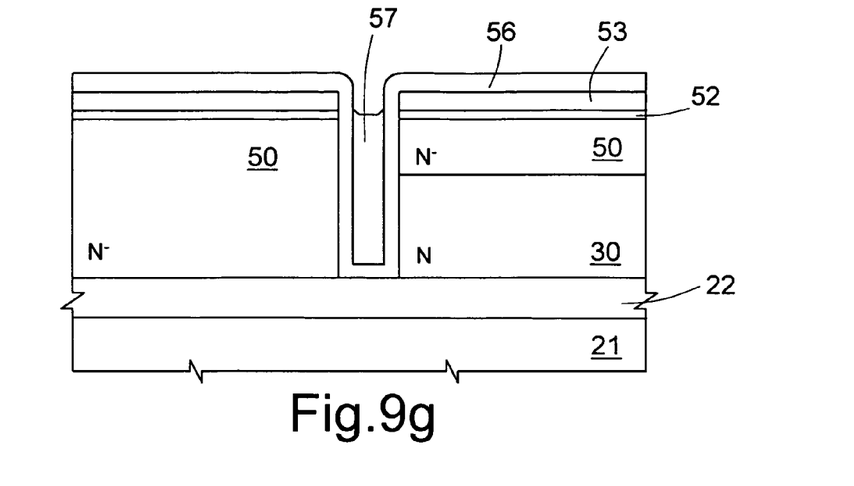

Next, an insulation-oxide layer 56 (FIG. 9e) and a polysilicon layer 57 having a thickness sufficient to "fill" the trench 55 are deposited (FIG. 9f. The polysilicon layer 57, when necessary, can be doped in situ. Alternatively, any one of the implantations that follow in the process sequence can be used for doping the polysilicon 57.

Figure 9H:
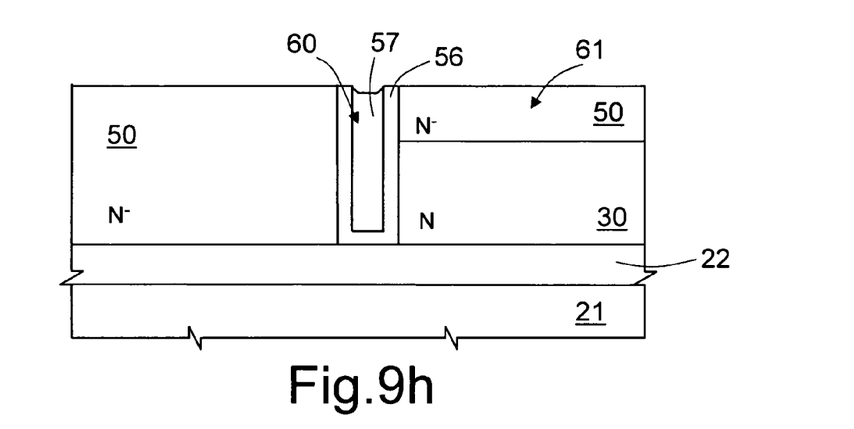
Figure 9I:
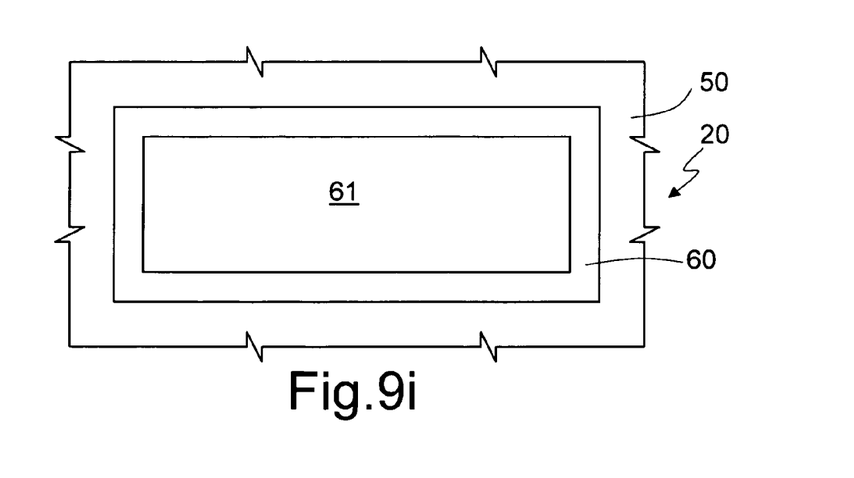
FIG. 9i shows a top plan view of the structure of FIG. 9h.

Next, the polysilicon layer 57 is etched until it is removed totally from the surface (FIG. 9g), and finally the nitride layer 53 and thin oxide layer 52 are removed (FIG. 9h). Thus a lateral-insulation region 60 is formed (see in particular FIG. 9i), which laterally surrounds an insulated well 61 and is connected, without any discontinuity, to the buried-oxide layer 22.

The use of a deposited oxide for the formation of the insulation-oxide layer 56 is advantageous in so far as it does not present phenomena of expansion which would lead to mechanical stress on the insulated well 61.

As an alternative to the above described with reference to FIGS. 9a-9c, as the hard mask 53 for etching of the silicon, an oxide layer may be used. This oxide must have characteristics such as to enable selective etching with respect to the buried-oxide layer 22. In addition, it must enable selective removal with respect to the insulation oxide 56 when it is desired to remove it after etching of the polysilicon 57. For example, as the hard mask 53, it is possible to use a P-VAPOX layer (i.e., VAPOX doped with phosphorus), which may even present a selectivity of beyond 100:1 with the other oxides already present in the structure, and consequently its removal is altogether innocuous. In this hypothesis (hard mask 53 of oxide), by appropriately calibrating the thickness of the hard mask it is also possible to do without the nitride layer.

The possibility of using various types of hard mask has the considerable advantage of allowing the process to be adapted to equipment available for etching silicon and in particular of choosing, between nitride and oxide, the material with respect to which the equipment has a better selectivity.

Next, in a way not shown, a thin oxide layer is grown, which oxidizes also the surface of the polysilicon 57 used for filling the trench (as may be seen in the top part of the lateral-insulation regions 60 in FIGS. 10-13), and which functions as pre-implantation oxide for the subsequent implantations.

Then, the steps of photomasking and resist development, implantation of N-type dopant at a high concentration for forming N-sinker regions 65 of NPN bipolar components (FIG. 10), and resist removal are carried out.

Then, the steps of photomasking and resist development, implantation of P-type dopant at a high concentration for forming P-sinker regions 66 of PNP bipolar components (FIG. 11), and resist removal are carried out. Thereby, the N-sinker regions 65 and P-sinker regions 66 are implanted using the same pre-implantation oxide. Alternatively, the pre-implantation oxide used for the previous implantation can be removed, and another oxide layer of appropriate thickness can be re-grown so as to block any possible surface self-doping due to dopant transportation in the oxide.

Next, a thermal cycle is performed for activating the dopants and for obtaining diffusion thereof. The phototechniques and the implantations regarding the N-sinker regions 65 and P-sinker regions 66 can be reversed without making any modification to the remaining part of the process sequence.

Should the process so envisage, next, using the same pre-implantation oxide previously grown or removing it and possibly growing another one of appropriate thickness, the following steps are carried out: photomasking and resist development, implantation of an N-type dopant for forming the N-well 68, which forms the well where the P-channel MOS components are integrated, and resist removal. Likewise, the P-well regions are formed. Next, a thermal cycle is performed to activate and diffuse the dopants. The phototechniques and the implantations regarding the two wells can be reversed.

After removing the thin oxide on the surface, the steps necessary for forming the components are carried out. In particular, according to the bipolar and/or MOS components to be formed (see FIGS. 10-13), the steps are carried out: growth of a gate oxide layer 69; deposition and definition of a polysilicon layer, forming gate regions 70; formation of a sealing oxide layer 71; masked implantation of an N-type dopant for forming base regions 72 for PNP transistors; masked implantation of a P-type dopant for forming base regions 73 of NPN transistors; thermal cycle; masked implantation of an N-type dopant for forming emitter regions 74 of NPN transistors and source and drain regions 75 of the NMOS transistors; masked implantation of a P-type dopant for forming emitter regions 76 of PNP transistors and source and drain regions 77 of the PMOS transistors; and thermal cycle.

The masked implantation steps described above can of course be carried out in any appropriate sequence.

Finally, contacting, forming metallization and passivation are carried out using known criteria and techniques.

According to a different embodiment, the part of process regarding the formation of the lateral-insulation regions 60 can be postponed and occupy any different point in the process sequence, up to the step prior to contacting. This solution has the advantage of preventing the insulation structure from feeling or being affected by the thermal processes included in the process sequence, for example for activation and diffusion of the dopant species and/or for growth of oxides, etc. Hereinafter a description will be given, purely by way of example, of a process sequence wherein the lateral-insulation regions 60 are formed immediately before the contacting step, as may be seen in FIG. 14, where an advanced manufacturing step of an NPN transistor is shown.

Figure 8:
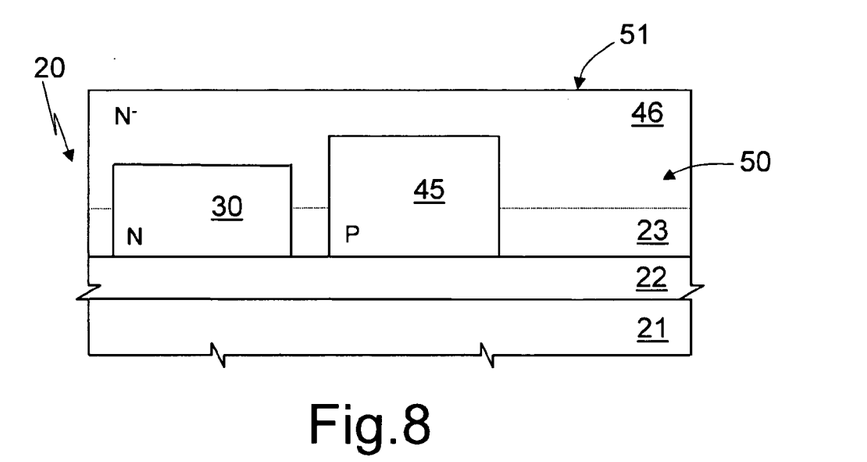

Starting from the intermediate structure of FIG. 8, a thin pre-implantation oxide is initially grown, then the sinker regions of N type and of P type (in FIG. 14, the N-sinker region 65) and the N-type and P-type well regions are formed.

Since, the present embodiment does not include, after epitaxial growth, the integration of the trench used for aligning of the subsequent phototechniques align, the process steps that precede the integration of the well and sinker regions can be preceded by a "zero layer" phototechnique, which, according to known criteria, generates the silicon steps on which the subsequent phototechniques can be aligned, reproducing the ones created prior to the epitaxial growth. To this aim, it is also possible to use, according to the epitaxial thickness, also the reference marks left by the initial "zero layer" or else by the first phototechnique for the integration of the buried layers.

Then, the thin oxide on the surface is removed, the gate-oxide layer is grown, the polysilicon layer is deposited and defined, the gate oxide is etched, the sealing and pre-implantation oxide layer is formed, and the base, emitter, source and drain regions are formed, in accordance the above described for the preceding process sequence.

Figure 14:
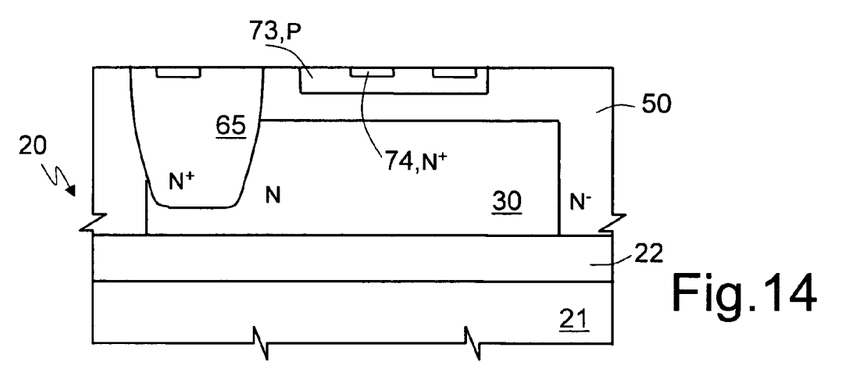
FIG. 14 is a cross-section of a further embodiment of the invention.

FIG. 14 shows the structure of an NPN transistor in this intermediate step, comprising, in addition to the N-sinker region 65, the base region 73 and the emitter region 74.

Figure 10:
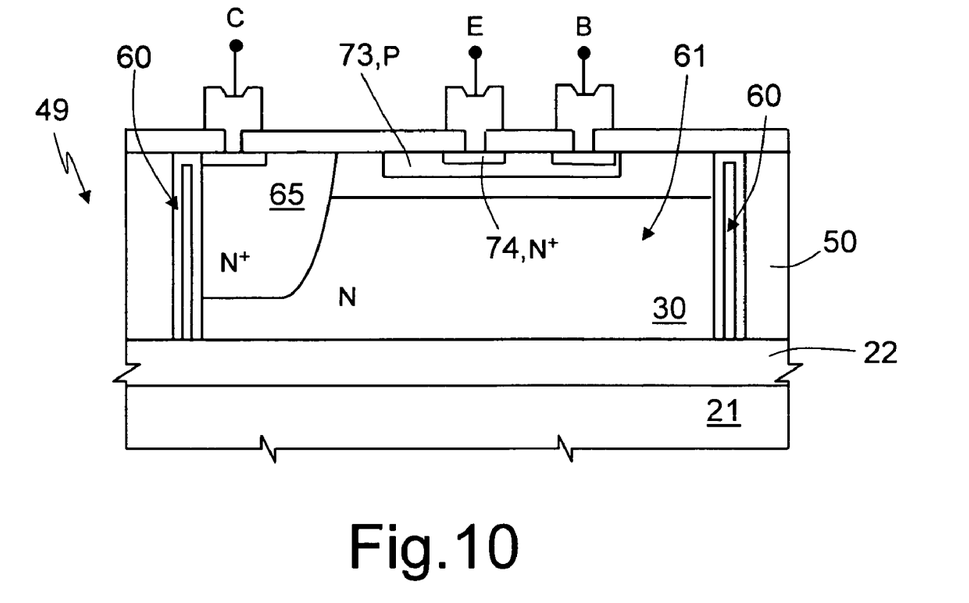
FIGS. 10-13 are cross-sections through portions of a SOI wafer in a final manufacturing step.
Figure 11:
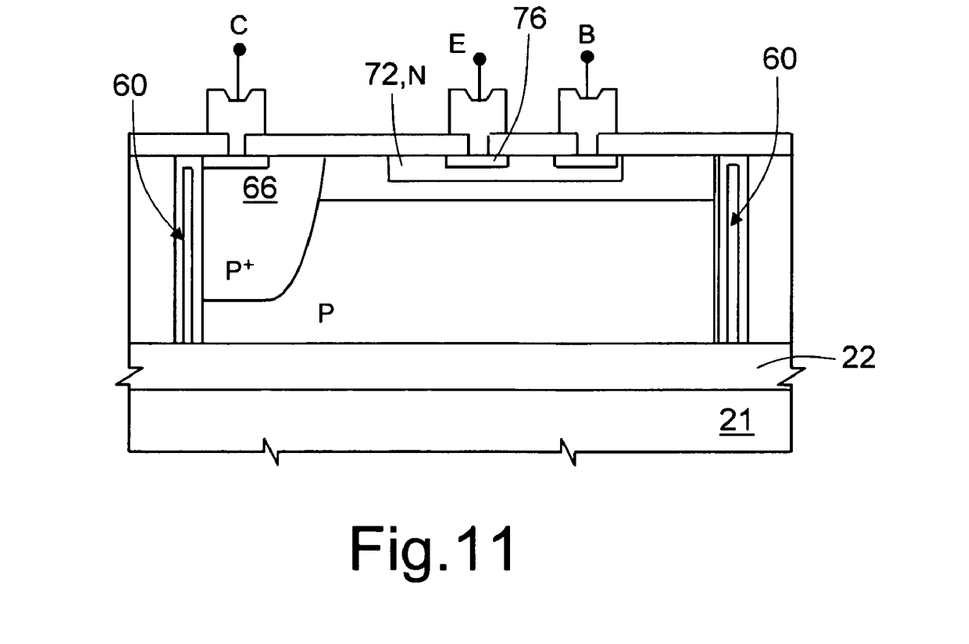
Figure 12:
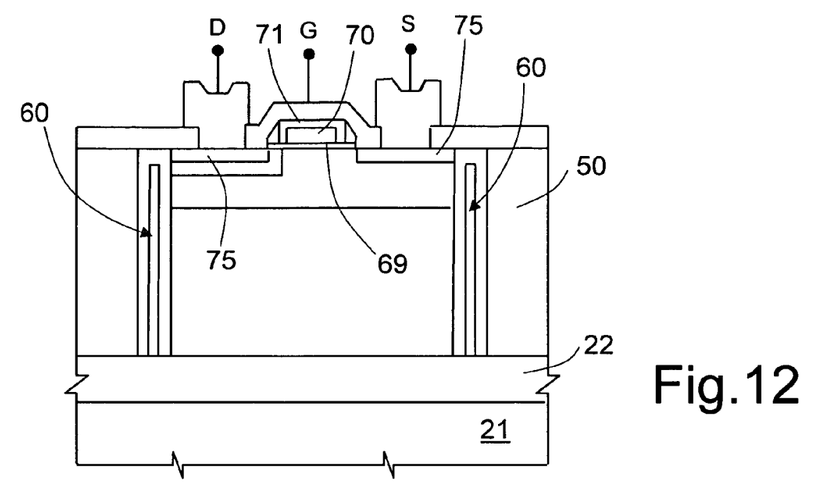
Figure 13:
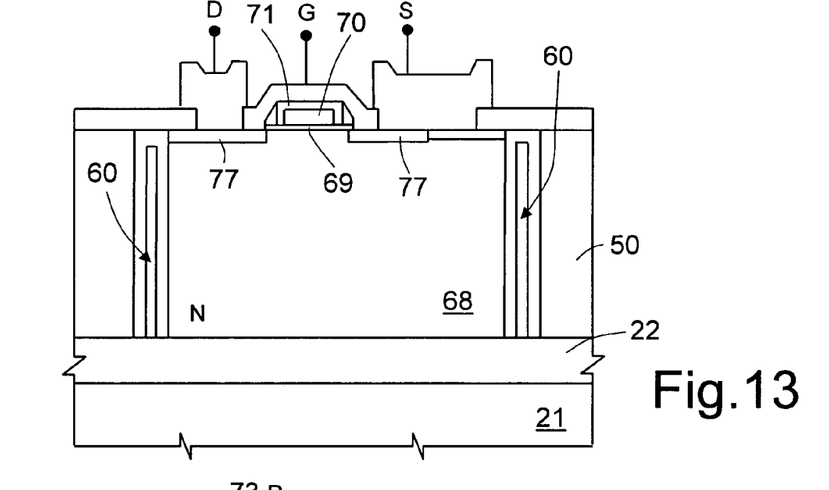

Next, the lateral-insulation regions 60 are formed, following the process already described previously, namely, using a nitride or oxide hard mask, digging trenches that surround the areas to be insulated, depositing oxide and filling the trenches with polysilicon so as to obtain the structure which, as regards an NPN transistor, is shown in FIG. 10. Proceeding with the fabrication process, contacts, metallization and passivation are formed using known criteria and techniques.

The advantages of the described processes are described hereinafter. First, since it does not comprise the formation of a field oxide for delimiting the active area, it is very versatile and is readily suited to introduce or displace the layer forming steps within the sequence according to the requirements, the type of technology and the characteristics of the individual components to be made.

Furthermore, the end structure has a stabilization of the gain value and a considerable reduction in the leakage currents thanks to the elimination of the dopant modulation in proximity of the silicon region underlying the bird's beak structure and thanks to the reduction of the defectiveness.

The process sequence is considerably simplified: in fact, some process steps are eliminated. The structure of the insulated well 61 is practically planar and does not have any step; the active region is therefore sturdier and more versatile for integration.

The structure of the insulated well does not require photolithographic rules of minimum distance between the trench, which defines the lateral insulation, and the LOCOS structure, which defines the active region. It follows that the active region is less cumbersome as compared to the solutions which use a LOCOS field oxide.

Finally, all the photolithographic rules necessary for defining the layers subsequent to the active region for integrating the various components refer to the trench 60 and are defined inside the active area by resist masks. Consequently, the typical problem of prior art LOCOS processes due to the modulation of the dopant concentration at the edges of the active area, and thus the dispersion of the electrical parameters does not exist any more.

Embodiments of the present invention may be utilized to form a variety of different types of electronic devices, such as the NPN, PNP, and MOS transistors mentioned in the described example embodiments. These devices may be included in many different types of integrated circuits, such as power devices, and such integrated circuits may in turn be contained in many different types of electronic systems, such as control, communications, and computer systems.

From the foregoing it will be appreciated that, although specific embodiments of the invention have been described herein for purposes of illustration, various modifications may be made without deviating from the spirit and scope of the invention.

The invention claimed is:

1. A process for manufacturing an electronic semiconductor device, comprising the steps of:
   providing a SOI wafer comprising a stack formed by a bottom layer of semiconductor material, an insulating layer and a top layer of semiconductor material;
   making alignment marks in said top layer;
   forming an implanted buried region in said top layer, aligned to said alignment marks;
   forming a hard mask on top of said top layer, the hard mask having an opening exposing the top layer within the alignment marks;
   using said hard mask, selectively removing a portion exposed in said top layer so as to form a trench extending up to said insulating layer;
   forming, in said trench, a lateral-insulation region contiguous to said insulating layer and delimiting, with said insulating layer, an insulated well of semiconductor material; and
   forming electronic components in said top layer.

2. The process according to claim 1, wherein said step of making alignment marks comprises forming locally oxidized regions on a portion of a surface of said top layer and removing said locally oxidized regions.

3. The process according to claim 2, comprising, before making locally oxidized regions, forming a local masking structure, wherein said step of forming an implanted buried region comprises implanting ionic dopant species using said local masking structure.

4. The process according to claim 1, wherein forming an implanted buried region comprises, after the step of making alignment marks, implanting dopant species.

5. The process according to claim 1, wherein, after the step of making alignment marks, a step of epitaxial growth is performed.

6. The process according to claim 1, wherein said step of forming a lateral-insulation region comprises: growing a surface oxide layer, which coats walls of said trench; and filling said trench.

7. The process according to claim 1, wherein said step of forming electronic components comprises forming regions of implanted sinkers.

8. The process according to claim 1, wherein said step of forming electronic components comprises forming bipolar transistors and/or MOS transistors.

9. The process according to claim 1, wherein said step of forming a trench is performed before the step of forming electronic components, and said step of forming electronic components comprises implantation steps aligned to said lateral-insulation region.

10. The process according to claim 1, wherein said step of forming a trench is performed after the step of forming electronic components, and said step of forming electronic components comprises implantation steps aligned to said alignment marks.

11. The method of claim 1 wherein forming a lateral-insulation region growing a surface oxide layer on walls of the trench and filling the trench with another material.

12. A method of manufacturing a semiconductor device, comprising:
   providing a silicon-on-insulator structure having a first semiconductor layer, a first insulating layer, and a second semiconductor layer;
   forming alignment marks in the second semiconductor layer;
   forming an implanted buried region in the second semiconductor layer, aligned with the alignment marks;
   forming a hard mask on top of the second semiconductor layer having an opening that maintains a portion of the second semiconductor layer exposed and the opening aligned within the alignment marks;
   selectively removing a portion of the second semiconductor layer pursuant to the hard mask, the removed portions of the second semiconductor layer forming a trench extending to the first insulating layer;
   forming, in the trench, a lateral-insulation region circumscribing a portion of the second semiconductor layer to define an insulated well ; and
   forming electronic components in the insulated well.

13. The method of claim 12 wherein forming alignment marks in the second semiconductor layer comprises:
   forming locally oxidized regions on a portion of a surface of second semiconductor layer; and
   removing the locally oxidized regions.

14. The method of claim 13 further comprising, before forming the locally oxidized regions, forming a local masking structure.

15. The method of claim 14 wherein forming an implanted buried region comprises implanting ionic dopant species using the local masking structure.

16. The method of claim 12 wherein forming electronic components comprises forming bipolar transistors and/or MOS transistors.

17. The method of claim 16 wherein the device is contained in one of a computer, control, and communications system.

* * * * *